United States Patent
Hall et al.

(10) Patent No.: US 9,087,913 B2
(45) Date of Patent: Jul. 21, 2015

(54) INTEGRATION TECHNIQUE USING THERMAL OXIDE SELECT GATE DIELECTRIC FOR SELECT GATE AND APARTIAL REPLACEMENT GATE FOR LOGIC

(71) Applicants: Mark D. Hall, Austin, TX (US); Mehul D. Shroff, Austin, TX (US); Frank K. Baker, Jr., Austin, TX (US)

(72) Inventors: Mark D. Hall, Austin, TX (US); Mehul D. Shroff, Austin, TX (US); Frank K. Baker, Jr., Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 240 days.

(21) Appl. No.: 13/790,004

(22) Filed: Mar. 8, 2013

(65) Prior Publication Data
US 2013/0267074 A1  Oct. 10, 2013

Related U.S. Application Data

(63) Continuation-in-part of application No. 13/442,142, filed on Apr. 9, 2012, now Pat. No. 8,722,493.

(51) Int. Cl.
*H01L 21/336* (2006.01)
*H01L 21/3205* (2006.01)
*H01L 21/82* (2006.01)
(Continued)

(52) U.S. Cl.
CPC .......... *H01L 21/82* (2013.01); *H01L 21/28008* (2013.01); *H01L 21/28273* (2013.01); *H01L 21/28282* (2013.01); *H01L 27/11526* (2013.01); *H01L 27/11534* (2013.01); *H01L 27/11536* (2013.01); *H01L 27/11573* (2013.01); *H01L 29/42328* (2013.01); *H01L 29/42332* (2013.01); *H01L 29/42344* (2013.01); *H01L 29/42348* (2013.01); *H01L 29/51* (2013.01); *H01L 29/66825* (2013.01); *H01L 29/66833* (2013.01); *H01L 29/7881* (2013.01)

(58) Field of Classification Search
USPC ......................................... 438/258, 267, 596
See application file for complete search history.

(56) References Cited

U.S. PATENT DOCUMENTS 5,614,746 A   3/1997   Hong et al.
6,087,225 A   7/2000   Bronner et al.
(Continued)

FOREIGN PATENT DOCUMENTS

WO    2009058486    5/2009

OTHER PUBLICATIONS

Office Action mailed Jan. 31, 2014 in U.S. Appl. No. 13/781,727.
(Continued)

*Primary Examiner* — Alexander Ghyka

(57) ABSTRACT

A thermally-grown oxygen-containing layer is formed over a control gate in an NVM region, and a high-k dielectric layer and barrier layer are formed in a logic region. A polysilicon layer is formed over the oxygen-containing layer and barrier layer and is planarized. A first masking layer is formed over the polysilicon layer and control gate defining a select gate location laterally adjacent the control gate. A second masking layer is formed defining a logic gate location. Exposed portions of the polysilicon layer are removed such that a select gate remains at the select gate location and a polysilicon portion remains at the logic gate location. A dielectric layer is formed around the select and control gates and polysilicon portion. The polysilicon portion is removed to result in an opening at the logic gate location which exposes the barrier layer.

20 Claims, 9 Drawing Sheets

(51) Int. Cl.
  *H01L 21/28* (2006.01)
  *H01L 27/115* (2006.01)
  *H01L 29/66* (2006.01)
  *H01L 29/423* (2006.01)
  *H01L 29/788* (2006.01)
  *H01L 29/51* (2006.01)

(56) References Cited

U.S. PATENT DOCUMENTS

| | | | |
|---|---|---|---|
| 6,130,168 A | 10/2000 | Chu et al. | |
| 6,194,301 B1 | 2/2001 | Radens et al. | |
| 6,235,574 B1 | 5/2001 | Tobben et al. | |
| 6,333,223 B1 | 12/2001 | Moriwaki et al. | |
| 6,388,294 B1 | 5/2002 | Radens et al. | |
| 6,509,225 B2 | 1/2003 | Moriwaki et al. | |
| 6,531,734 B1 | 3/2003 | Wu | |
| 6,635,526 B1 | 10/2003 | Malik et al. | |
| 6,707,079 B2 | 3/2004 | Satoh et al. | |
| 6,777,761 B2 | 8/2004 | Clevenger et al. | |
| 6,785,165 B2 | 8/2004 | Kawahara et al. | |
| 6,861,698 B2 | 3/2005 | Wang | |
| 6,939,767 B2 | 9/2005 | Hoefler et al. | |
| 7,154,779 B2 | 12/2006 | Mokhlesi et al. | |
| 7,183,159 B2 | 2/2007 | Rao et al. | |
| 7,190,022 B2 | 3/2007 | Shum et al. | |
| 7,202,524 B2 | 4/2007 | Kim et al. | |
| 7,208,793 B2 | 4/2007 | Bhattacharyya | |
| 7,256,125 B2 | 8/2007 | Yamada et al. | |
| 7,271,050 B2 | 9/2007 | Hill | |
| 7,365,389 B1 | 4/2008 | Jeon et al. | |
| 7,391,075 B2 | 6/2008 | Jeon et al. | |
| 7,402,493 B2 | 7/2008 | Oh et al. | |
| 7,405,968 B2 | 7/2008 | Mokhlesi et al. | |
| 7,439,134 B1 | 10/2008 | Prinz et al. | |
| 7,476,582 B2 | 1/2009 | Nakagawa et al. | |
| 7,521,314 B2 | 4/2009 | Jawarani et al. | |
| 7,524,719 B2 | 4/2009 | Steimle et al. | |
| 7,544,490 B2 | 6/2009 | Ferrari et al. | |
| 7,544,980 B2 | 6/2009 | Chindalore et al. | |
| 7,544,990 B2 | 6/2009 | Bhattacharyya | |
| 7,560,767 B2 | 7/2009 | Yasuda et al. | |
| 7,745,344 B2 | 6/2010 | Chindalore | |
| 7,795,091 B2 | 9/2010 | Winstead et al. | |
| 7,799,650 B2 | 9/2010 | Bo et al. | |
| 7,816,727 B2 | 10/2010 | Lai et al. | |
| 7,821,055 B2 | 10/2010 | Loiko et al. | |
| 7,906,396 B1 | 3/2011 | Chiang et al. | |
| 7,932,146 B2 | 4/2011 | Chen et al. | |
| 7,989,871 B2 | 8/2011 | Yasuda | |
| 7,999,304 B2 | 8/2011 | Ozawa et al. | |
| 8,017,991 B2 | 9/2011 | Kim et al. | |
| 8,043,951 B2 | 10/2011 | Beugin et al. | |
| 8,063,434 B1 | 11/2011 | Polishchuk et al. | |
| 8,093,128 B2 | 1/2012 | Koutny, Jr. et al. | |
| 8,138,037 B2 | 3/2012 | Chudzik et al. | |
| 8,168,493 B2 | 5/2012 | Kim | |
| 8,173,505 B2 * | 5/2012 | Herrick et al. | 438/258 |
| 8,298,885 B2 | 10/2012 | Wei et al. | |
| 8,334,198 B2 | 12/2012 | Chen et al. | |
| 8,372,699 B2 | 2/2013 | Kang et al. | |
| 8,389,365 B2 | 3/2013 | Shroff et al. | |
| 8,399,310 B2 | 3/2013 | Shroff et al. | |
| 8,524,557 B1 | 9/2013 | Hall et al. | |
| 8,536,006 B2 | 9/2013 | Shroff et al. | |
| 8,536,007 B2 | 9/2013 | Shroff et al. | |
| 8,679,927 B2 | 3/2014 | Ramkumar et al. | |
| 8,871,598 B1 | 10/2014 | Perera | |
| 8,901,632 B1 | 12/2014 | Perera et al. | |
| 2001/0049166 A1 | 12/2001 | Peschiaroli et al. | |
| 2002/0061616 A1 | 5/2002 | Kim et al. | |
| 2003/0022434 A1 | 1/2003 | Taniguchi et al. | |
| 2003/0143792 A1 * | 7/2003 | Satoh et al. | 438/197 |
| 2004/0075133 A1 | 4/2004 | Nakagawa et al. | |
| 2004/0188753 A1 * | 9/2004 | Kawashima et al. | 257/316 |
| 2004/0262670 A1 | 12/2004 | Takebuchi et al. | |
| 2005/0145949 A1 | 7/2005 | Sadra et al. | |
| 2006/0038240 A1 | 2/2006 | Tsutsumi et al. | |
| 2006/0046449 A1 | 3/2006 | Liaw | |
| 2006/0099798 A1 | 5/2006 | Nakagawa | |
| 2006/0134864 A1 | 6/2006 | Higashitani et al. | |
| 2006/0211206 A1 | 9/2006 | Rao et al. | |
| 2006/0221688 A1 | 10/2006 | Shukuri et al. | |
| 2007/0037343 A1 | 2/2007 | Colombo et al. | |
| 2007/0077705 A1 | 4/2007 | Prinz et al. | |
| 2007/0115725 A1 | 5/2007 | Pham et al. | |
| 2007/0215917 A1 | 9/2007 | Taniguchi | |
| 2007/0224772 A1 | 9/2007 | Hall et al. | |
| 2007/0249129 A1 | 10/2007 | Hall et al. | |
| 2007/0264776 A1 | 11/2007 | Dong et al. | |
| 2008/0029805 A1 | 2/2008 | Shimamoto et al. | |
| 2008/0050875 A1 | 2/2008 | Moon et al. | |
| 2008/0067599 A1 | 3/2008 | Tsutsumi et al. | |
| 2008/0105945 A1 | 5/2008 | Steimle et al. | |
| 2008/0121983 A1 | 5/2008 | Seong et al. | |
| 2008/0128785 A1 | 6/2008 | Park et al. | |
| 2008/0145985 A1 | 6/2008 | Chi | |
| 2008/0185635 A1 | 8/2008 | Yanagi et al. | |
| 2008/0237690 A1 | 10/2008 | Anezaki et al. | |
| 2008/0237700 A1 | 10/2008 | Kim et al. | |
| 2008/0283900 A1 | 11/2008 | Nakagawa et al. | |
| 2008/0290385 A1 | 11/2008 | Urushido | |
| 2008/0308876 A1 | 12/2008 | Lee et al. | |
| 2009/0050955 A1 | 2/2009 | Akita et al. | |
| 2009/0065845 A1 | 3/2009 | Kim et al. | |
| 2009/0072274 A1 | 3/2009 | Knoefler et al. | |
| 2009/0078986 A1 | 3/2009 | Bach | |
| 2009/0101961 A1 | 4/2009 | He et al. | |
| 2009/0111229 A1 | 4/2009 | Steimle et al. | |
| 2009/0179283 A1 | 7/2009 | Adams et al. | |
| 2009/0225602 A1 | 9/2009 | Sandhu et al. | |
| 2009/0256211 A1 | 10/2009 | Booth, Jr. et al. | |
| 2009/0269893 A1 | 10/2009 | Hashimoto et al. | |
| 2009/0273013 A1 | 11/2009 | Winstead et al. | |
| 2009/0278187 A1 | 11/2009 | Toba | |
| 2010/0099246 A1 * | 4/2010 | Herrick et al. | 438/591 |
| 2011/0031548 A1 | 2/2011 | White et al. | |
| 2011/0095348 A1 | 4/2011 | Chakihara et al. | |
| 2011/0204450 A1 | 8/2011 | Moriya | |
| 2011/0260258 A1 | 10/2011 | Zhu et al. | |
| 2012/0034751 A1 | 2/2012 | Ariyoshi et al. | |
| 2012/0104483 A1 | 5/2012 | Shroff et al. | |
| 2012/0132978 A1 | 5/2012 | Toba et al. | |
| 2012/0142153 A1 | 6/2012 | Jeong | |
| 2012/0248523 A1 | 10/2012 | Shroff et al. | |
| 2012/0252171 A1 | 10/2012 | Shroff et al. | |
| 2013/0026553 A1 | 1/2013 | Horch | |
| 2013/0037886 A1 | 2/2013 | Tsai et al. | |
| 2013/0065366 A1 | 3/2013 | Thomas et al. | |
| 2013/0084684 A1 | 4/2013 | Ishii et al. | |
| 2013/0137227 A1 | 5/2013 | Shroff et al. | |
| 2013/0171785 A1 | 7/2013 | Shroff et al. | |
| 2013/0171786 A1 | 7/2013 | Shroff et al. | |
| 2013/0178027 A1 | 7/2013 | Hall et al. | |
| 2013/0178054 A1 | 7/2013 | Shroff et al. | |
| 2013/0214346 A1 * | 8/2013 | Hall et al. | 257/325 |
| 2013/0264633 A1 | 10/2013 | Hall et al. | |
| 2013/0264634 A1 | 10/2013 | Hall et al. | |
| 2013/0267072 A1 | 10/2013 | Hall et al. | |
| 2013/0267074 A1 | 10/2013 | Hall et al. | |
| 2013/0323922 A1 | 12/2013 | Shen et al. | |
| 2014/0035027 A1 | 2/2014 | Chakihara et al. | |
| 2014/0050029 A1 | 2/2014 | Kang et al. | |
| 2014/0120713 A1 | 5/2014 | Shroff et al. | |
| 2014/0227843 A1 * | 8/2014 | Tsukamoto et al. | 438/275 |
| 2015/0041875 A1 | 2/2015 | Perera et al. | |
| 2015/0054044 A1 | 2/2015 | Perera et al. | |

OTHER PUBLICATIONS

Krishnan, S., et al.., "A Manufacturable Dual Channel (Si and SiGe) High-K Metal Gate CMOS Technology with Multiple Oxides for High Performance and Low Power Applications", IEEE, Feb. 2011

(56) References Cited

OTHER PUBLICATIONS

IEEE International Electron Devices Meeting (IEDM), 28.1.1-28.1. 4, pp. 634-637.
Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.
Liu, Z., et al., "Metal Nanocrystal Memories—Part I: Device Design and Fabrication", IEEE Transactions on Electron Devices, vol. 49, No. 9, Sep. 2002, pp. 1606-1613.
Wang, X.P., et al., Dual Metal Gates with Band-Edge Work Functions on Novel HfLaO High-K Gate Dielectric, IEEE, Symposium on VLSI Technology Digest of Technical Papers, 2006.
U. S. Appl. No. 13/491,771, Hall et al , "Integrating Formation of a Replacement Ggate Transistor and a Non-Volatile Memory Cell Using a High-K Dielectric", Office Action—Rejection, Sep. 9, 2013.
U.S. Appl. No. 13/442,142, Hall, M.D., et al., "Logic Transistor and Non-Volatile Memory Cell Integration", Office Action—Allowance, Aug. 2, 2013.
U.S. Appl. No. 13/907,491, Hall, M.D., et al., "Logic Transistor and Non-Volatile Memory Cell Integration", Office Action—Rejection, Sep. 3, 2013.
U.S. Appl. No. 12/915,726, Shroff, M., et al., "Non-Volatile Memory and Logic Circuit Process Integration", Office Action—Restriction, Jul. 31, 2012.
U.S. Appl. No. 12/915,726, Shroff, M., et al., "Non-Volatile Memory and Logic Circuit Process Integration", Office Action—Allowance, Dec. 10, 2012.
U.S. Appl. No. 13/781,727, Shroff, M., et al., "Methods of Making Logic Transistors and non-Volatile Memory Cells", Office Action—Restriction, Jun. 21, 2013.
U.S. Appl. No. 13/781,727, Shroff, M., et al., "Methods of Making Logic Transistors and non-Volatile Memory Cells", Office Action—Rejection, Aug. 22, 2013.
U.S. Appl. No. 13/077,491, Shroff, M.., et al., "Non-Volatile Memory and Logic Circuit Process Integration", Office Action—Rejection, Aug. 15, 2012.
U.S. Appl. No. 13/077,491, Shroff, M.., et al., "Non-Volatile Memory and Logic Circuit Process Integration", Office Action—Rejection, Feb. 6, 2013.
U.S. Appl. No. 13/077,491, Shroff, M.., et al., "Non-Volatile Memory and Logic Circuit Process Integration", Office Action - Allowance, Jun. 18, 2013.
U.S. Appl. No. 13/077,501, Shroff, M.., et al., "Non-Volatile Memory and Logic Circuit Process Integration", Office Action—Allowance, Nov. 26, 2012.
U.S. Appl. No. 13/313,179, Shroff, M., et al., "Method of Protecting Against Via Failure and Structure Therefor", Office Action—Rejection, Aug. 15, 2013.
U.S. Appl. No. 13/307,719, Shroff, M., et al., "Logic and Non-Volatile Memory (NVM) Integration", Office Action—Allowance, May 29, 2013.
U.S. Appl. No. 13/343,331, Shroff, M., et al., "Non-Volatile Memory (NVM) and Logic Integration", Office Action—Rejection, Mar. 13, 2013.
U.S. Appl. No. 13/343,331, Shroff, M., et al., "Non-Volatile Memory (NVM) and Logic Integration", Office Action—Allowance, Jun. 24, 2013.
U.S. Appl. No. 13/441,426, Shroff, M., et al., "Non-Volatile Memory (NVM) and Logic Integration", Office Action—Allowance, Sep. 9, 2013.
U.S. Appl. No. 13/780,574, Hall, M.D., et al., Non-Volatile Memory (NVM) and Logic Integration, Office Action—Allowance, Sep. 6, 2013.
U.S. Appl. No. 13/491,760, Shroff, M.., et al., "Integrating Formation of a Replacement Gate Transistor and a Non-Volatile Memory Cell Using an Interlayer Dielectric", Office Action—Allowance, Jul. 1, 2013.
U.S. Appl. No. 13/491,771, Hall, M., et al., "Integrating Formation of a Replacement Gate Transistor and a Non-Volatile Memory Cell Using a High-K Dielectric", filed Jun. 8, 2012.
U.S. Appl. No. 13/790,225, Hall, M., et al., "Integrating Formation of a Replacement Gate Transistor and a non-Volatile Memory Cell Having Thin Film Storage", filed Mar. 8, 2013.
U.S. Appl. No. 13/790,014, Hall, M., et al., "Integrating Formation of a Logic Transistor and a None-Volatile Memory Cell Using a Partial Replacement Gate Technique", filed Mar. 8, 2013.
U.S. Appl. No. 13/780,591, Hall, M.D., et al., "Non-Volatile Memory (NVM) and Logic Integration", filed Feb. 28, 2013.
U.S. Appl. No. 13/491760, Shroff, M.D., et al., "Integrating Formation of a Replacement Gate Transistor and a Non-Volatile Memory Cell Using an Interlayer Dielectric", filed Jun. 8, 2012.
U.S. Appl. No. 13/661,157, Shroff, M.D., et al., "Method of Making a Logic Transistor and a Non-Volatile Memory (NVM) Cell", file Oct. 26, 2012.
U.S. Appl. No. 13/907,491, Hall, M.D., et al., "Logic Transistor and Non-Volatile Memory Cell Integration", Office Action—Rejection mailed Sep. 3, 2013.
U.S. Appl. No. 13/780,591, Hall, M.D., et al., "Non-Volatile Memory (NVM) and Logic Integration", Office Action—Allowance mailed Nov. 22, 2013.
U.S. Appl. No. 13/790,225, Hall, M.D., et al., "Integrating Formation of a Replacement Gate Transistor and Non-Volatile Memory Cell Having Thin Film Storage", Office Action—Allowance mailed Dec. 24, 2013.
U.S. Appl. No. 13/790,014, Hall, M.D., et al., "Integrating Formation of a Logic Transistor and a Non-Volatile Memory Cell Using a Partial Replacement Gate Technique", Office Action—Allowance mailed Dec. 24, 2013.
U.S. Appl. No. 13/780,574, Hall, M.D., et al., "Non-Volatile Memory (NVM) and Logic Integration", Office Action—Allowance mailed Dec. 24, 2013.
U.S. Appl. No. 13/442,142, Hall, M.D., et al., "Logic Transistor and Non-Volatile Memory Cell Integration", Office Action—Allowance mailed Dec. 31, 2013.
U.S. Appl. No. 13/491,771, Hall et al , "Integrating Formation of a Replacement Ggate Transistor and a Non-Volatile Memory Cell Using a High-K Dielectric", Office Action—Allowance, Jan. 16, 2014.
Office Action—Allowance mailed Feb. 21, 2014 in U.S. Appl. No. 13/441,426.
Office Action—Allowance mailed Feb. 28, 2014 in U.S. Appl. No. 13/442,142.
Office Action—Allowance mailed Mar. 3, 2014 in U.S. Appl. No. 13/790,014.
Office Action—Allowance mailed Mar. 6, 2014 in U.S. Appl. No. 13/491,771.
Office Action—Allowance mailed Mar. 11, 2014 in U.S. Appl. No. 13/907,491.
Office Action—Allowance mailed Mar. 12, 2014 for U.S. Appl. No. 13/790,225.
Pei, Y., et al., "MOSFET Nonvolatile Memory with High-Density Cobalt-Nanodots Floating Gate and Hf02 High-k Blocking Dielectric", IEEE Transactions of Nanotechnology, vol. 10, No. 3, May 2011, pp. 528-531.
Chen, J.H., et al., "Nonvolatile Flash Memory Device Using Ge nanocrystals Embedded in HfA10 High-k Tunneling and Control Oxides: Device Fabrication and Electrical Performance", IEEE Transactions on Electron Devices, vol. 51, No. 11, Nov. 2004, pp. 1840-1848.
Kang, T.K., et al, "Improved characteristics for Pd nanocrystal memory with stacked HfAIO-Si02 tunnel layer", Sciencedirect.com, Solid-State Electronics, vol. 61, Issue 1, Jul. 2011, pp. 100-105, http://www.sciencedirect.com/science/article/pii/S003811 0111 000803.
Mao, P., et al., "Nonvolatile memory devices with high density ruthenium nanocrystals", Applied Physics Letters, vol. 93, Issue 24, Electronic Transport and Semiconductors, 2006.

(56) References Cited

OTHER PUBLICATIONS

Mao, P., et ai, "Nonvolatile Memory Characteristics with Embedded High Density Ruthenium Nanocrystals", http://iopscience.iop.org/0256-307X/26/5/0561 04, Chinese Physics Letters, vol. 26, No. 5, 2009.
U.S. Appl. No. 13/307,719, Shroff, M., et al, "Logic and Non-Volatile Memory (NVM) Integration", filed Nov. 30, 2011.
U.S. Appl. No. 13/343,331, Shroff, M., et al, "Non-Volatile Memory (NVM) and Logic Integration", filed Jan. 4, 2012.
U.S. Appl. No. 13/402,426, Hall, et al., Office Action -Notice of Allowance, mailed May 3, 2013.
U.S. Appl. No. 13/789,971, Hall, et al., Office Action—Notice of Allowance, mailed May 15, 2013.
U.S. Appl. No. 13/442,142, Hall, et al., Office Action—Ex Parte Quayle, mailed Apr. 4, 2013.
U.S. Appl. No. 13/969,180, Perera, Office Action—Allowance, mailed Aug. 5, 2014.
U.S. Appl. No. 13/781,727, Shroff, Office Action—Allowance, mailed Aug. 15, 2014.
U.S. Appl. No. 13/955,665, Office Action—Allowance, mailed Aug. 20, 2014.
U.S. Appl. No. 13/973,549, Hong, Office Action—Restriction, mailed Aug. 26, 2014.
U.S. Appl. No. 13/441,426, Shroff, Office Action—Allowance, mailed Sep. 26, 2014.
U.S. Appl. No. 13/661,157, Office Action—Restriction, mailed Oct. 2, 2014.
U.S. Appl. No. 14/041,662, Perera, Office Action—Allowance, mailed Oct. 17, 2014.
U.S. Appl. No. 13/973,549, Hong, Office Action—Allowance, mailed Nov. 14, 2014.
U.S. Appl. No. 13/781,727, Office Action—Allowance, May 12, 2014.
U.S. Appl. No. 13/343,331, Office Action—Allowance, Nov. 8, 2013.
U.S. Appl. No. 13/441,426, Shroff, M. D., et al., Office Action—Allowance, mailed Jun. 9, 2014.
U.S. Appl. No. 13/780,591, Hall, M.D., et al., Office Action—Allowance, mailed May 12, 2014.
U.S. Appl. No. 13/928,666, Hong, C.M. et al., Office Action—Rejection, mailed Jul. 23, 2014.
U.S. Appl. No. 14/041,662, Perera, A.H., et al., Office Action—Restriction, mailed Aug. 1, 2014.
U.S. Appl. No. 14/291,359, filed May 30, 2014, entitled Split Gate Nanocrystal Memory Integration.
U.S. Appl. No. 13/971,987, filed Aug. 21, 2013, entitled "Integrated Split Gate Non-Volatile Memory Cell and Logic Structure".
U.S. Appl. No. 13/972,372, filed Aug. 21, 2013, entitled "Integrated Split Gate Non-Volatile Memory Cell and Logic Device".
Office Action mailed Dec. 4, 2014 for U.S. Appl. No. 13/972,372, 5 pages.
Office Action mailed Dec. 5, 2014 for U.S. Appl. No. 13/962,338, 7 pages.
Office Action mailed Dec. 5, 2014 for U.S. Appl. No. 13/971,987, 5 pages.
Office Action mailed Feb. 12, 2015 for U.S. Appl. No. 13/971,987, 7 pages.
Notice of Allowance mailed Apr. 27, 2015 for U.S. Appl. No. 13/971,987, 12 pages.
First Action Interview Office Action mailed May 22, 105 for U.S. Appl. No. 13/972,372, 12 pages.
Notice of Allowance mailed May 13, 2014 for U.S. Appl. No. 13/962,338, 11 pages.
Restriction Requirement mailed May 14, 2015 for U.S. Appl. No. 14/291,359, 8 pages.

\* cited by examiner

INTEGRATION TECHNIQUE USING THERMAL OXIDE SELECT GATE DIELECTRIC FOR SELECT GATE AND APARTIAL REPLACEMENT GATE FOR LOGIC

CROSS-REFERENCE TO RELATED APPLICATION

This application is related to U.S. patent application Ser. No. 13/789,971, titled "INTEGRATION TECHNIQUE USING THERMAL OXIDE SELECT GATE DIELECTRIC FOR SELECT GATE AND REPLACEMENT GATE FOR LOGIC," naming Mark D. Hall, Mehul D. Shroff, and Frank K. Baker as inventors, assigned to the current assignee hereof, and filed on even date herewith.

This application is continuation-in-part of U.S. patent application Ser. No. 13/442,142, filed on Apr. 9, 2012, titled "LOGIC TRANSISTOR AND NON-VOLATILE MEMORY CELL INTEGRATION," naming Mehul D. Shroff and Mark D. Hall as inventors, and assigned to the current assignee hereof, and which is hereby incorporated by reference.

BACKGROUND

1. Field

This disclosure relates generally to non-volatile memories, and more specifically, to integrating non-volatile memories with logic transistors on the same integrated circuit.

2. Related Art

Many semiconductor devices include, or embed, non-volatile memory (NVM) transistors with other transistor types on the same integrated circuit (IC). The manufacturing processes for the different transistor types may not be the same, requiring that the processes be integrated. For example, to integrate NVM with CMOS (complementary metal oxide semiconductor), the CMOS process may be modified to include the process steps necessary to fabricate the NVM memory cell and the supporting devices.

Flash NVM is commonly embedded in, for example, system-on-a-chip (SoC) integrated circuits having CMOS logic circuitry. The flash NVM may include a floating gate comprising polysilicon, or use a charge storage layer comprising nanocrystals or an ONO (oxide-nitride-oxide) layer. The memory cell may also include a control gate comprising polysilicon, a metal, or both. In addition, it may be desirable to use a high-k (where k refers to the dielectric constant of the material) gate dielectric in the logic transistor. Integrating the non-volatile memory cell with the logic transistor having the metal gate and the high-k gate dielectric on the same integrated circuit may require many additional process steps.

What is needed is a process integration methodology to efficiently embed a NVM cell array with metal gate/high-k dielectric logic transistors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an integration of a non-volatile memory (NVM) cell and a logic transistor efficiently integrates NVM and logic on a single integrated circuit. This integration utilizes thermal oxide for the gate dielectric of the select gate and partial replacement gate to obtain metal gates for the logic. This is better understood by reference to the drawings and the following description.

The semiconductor substrate described herein can be any semiconductor rsubstrate having a thermally oxidizable top surface.

Figure 1:
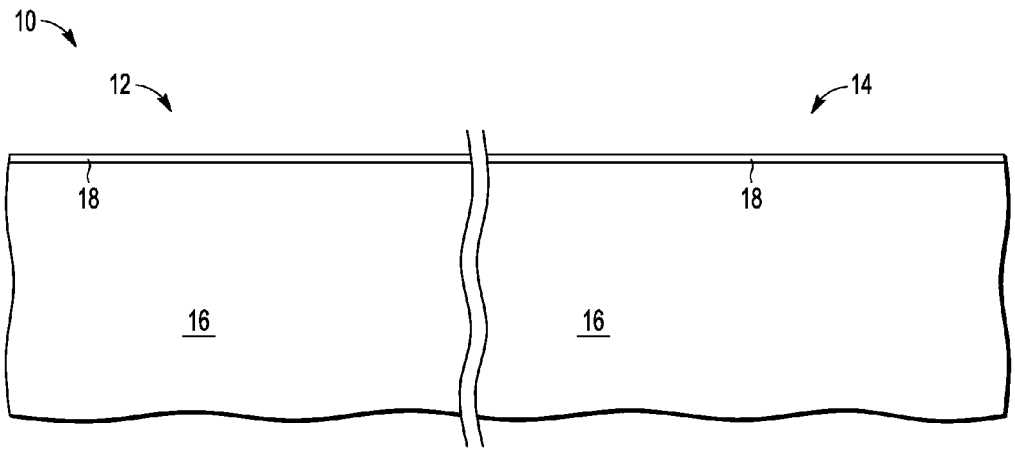
FIG. 1 is a cross section of a semiconductor device at a stage in processing according to an embodiment.

Shown in FIG. 1 is a semiconductor device 10 having a semiconductor substrate 16, an NVM region 12 in and over a portion of substrate 16, a logic region 14 in and over a portion of substrate 16, and a hard mask layer 18 over substrate 16. In and over the same substrate 16, there may be other regions as well. A process for forming a single logic transistor and a single NVM cell will be shown in subsequent figures and are exemplary of other transistors and memory cells to be formed in those regions. Hard mask layer 18 may be nitride and may be about 100 Angstroms thick. Other materials and thicknesses may also be used.

Figure 2:
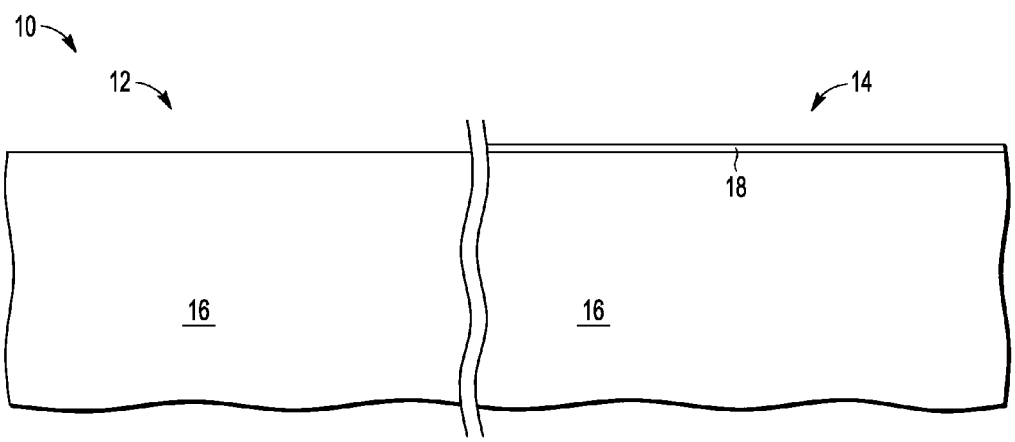
FIG. 2 is a cross section of the semiconductor device of FIG. 1 at a subsequent stage in processing.

Shown in FIG. 2 is semiconductor device 10 after removing hard mask layer 18 from NVM region 12. A mask, not shown, is used for this etch.

Figure 3:
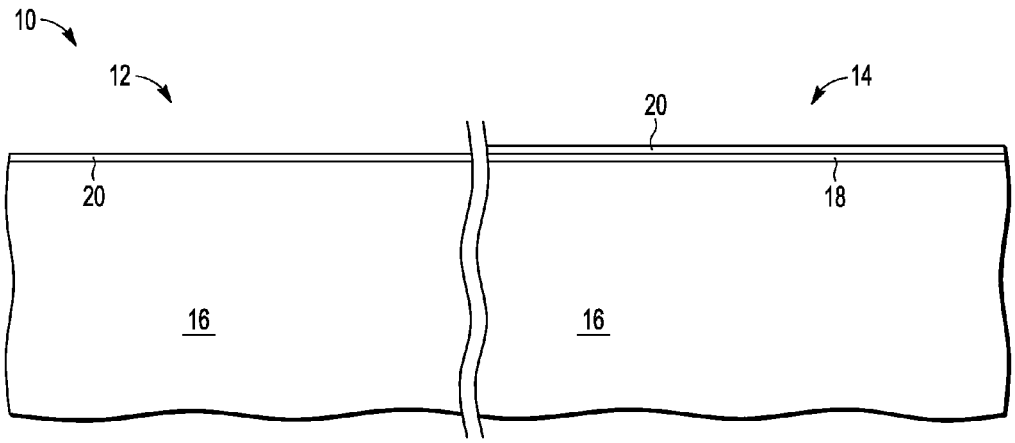
FIG. 3 is a cross section of the semiconductor device of FIG. 2 at a subsequent stage in processing.

Shown in FIG. 3 is semiconductor device 10 after depositing a charge storage layer 20 over NVM region 12 on substrate 16 and over logic region 14 on hard mask layer 18.

Figure 4:
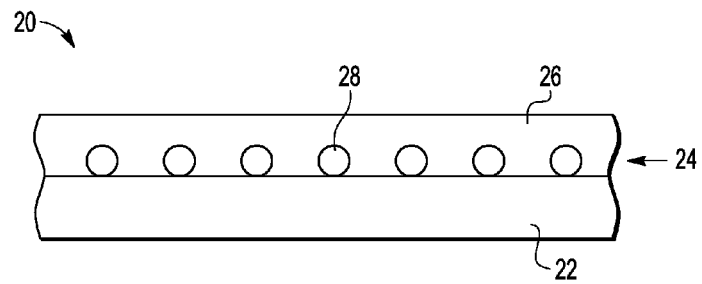
FIG. 4 is a portion of the semiconductor device shown in FIG. 3 in more detail.

Shown in FIG. 4 is charge storage layer 20 in more detail. Charge storage layer 20 has a dielectric layer 22 on substrate 16, a plurality of nanocrystals 24 on dielectric layer 22 including an exemplary nanocrystal 28, and a dielectric layer 26 on dielectric layer 22 and on and around nanocrystals 24. Dielectric layers 22 and 26 are preferably oxide. Dielectric layer 22 is the dielectric layer through which charge flows to nanocrystals 24 for program as well as the gate dielectric between nanocrystals 24 and a channel. Dielectric layer 26 is the dielectric layer through which charge flows from nanocrystals 24 for erase. Nanocrystals 24 are preferably silicon in order to be able to withstand a subsequent thermal oxidation step.

Figure 5:
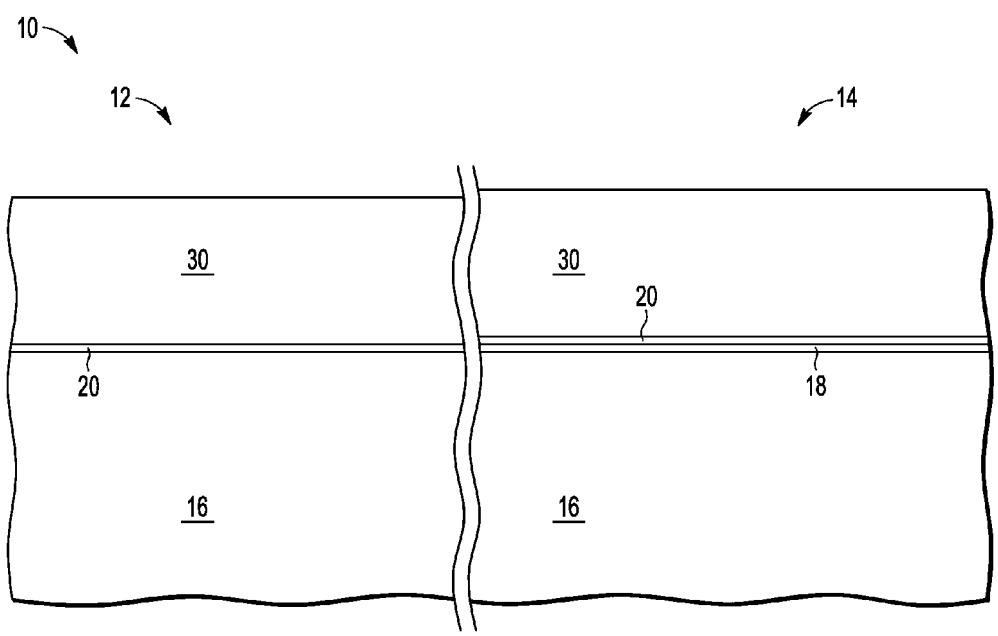
FIG. 5 is a cross section of the semiconductor device of FIG. 3 at a subsequent stage in processing.

Shown in FIG. 5 is a semiconductor device after forming a gate material 30 on charge storage layer 20 in NVM region 12 and logic region 14. Gate material 30 may have a thickness of about 800-1000 Angstroms. Gate material 30 may be metal which may provide a benefit over polysilicon. Polysilicon may be used as well. Gate material 30 may also be a stack of conductive materials that may include metal and polysilicon.

Figure 6:
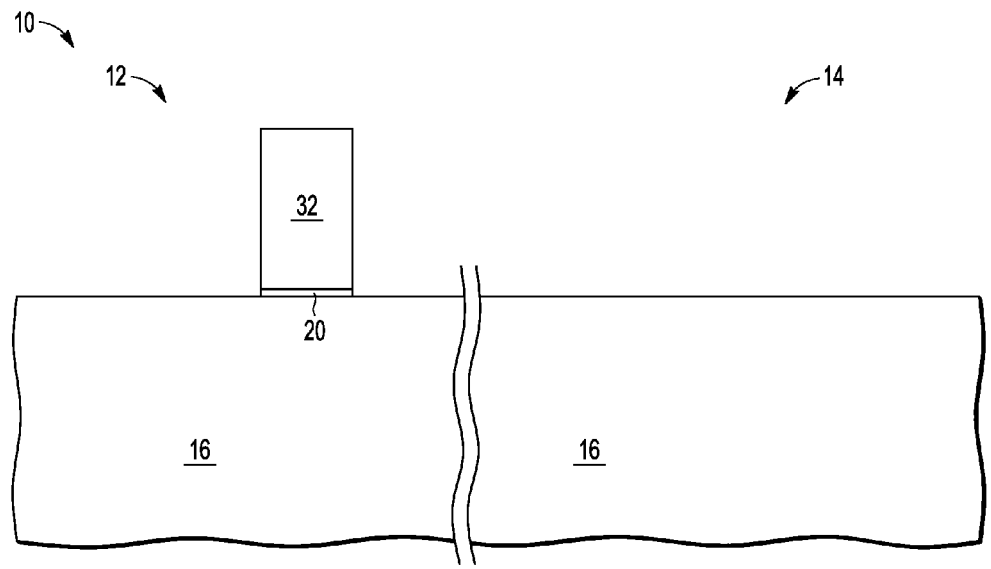
FIG. 6 is a cross section of the semiconductor device of FIG. 5 at a subsequent stage in processing.

Shown in FIG. 6 is semiconductor device 10 after etching gate material 30 and charge storage layer 20. There need not be any change to gate material 30 other than patterning it, but the result is what will be used as a functional structure, control gate 32, in NVM region 12. Gate material 30, charge storage layer 20, and hard mask layer 18 are removed from logic region 14 so that a top surface of substrate 16 will be exposed in logic region 14. The top portion of substrate 16 is also exposed in NVM region 12 except where control gate 32 is present.

Figure 7:
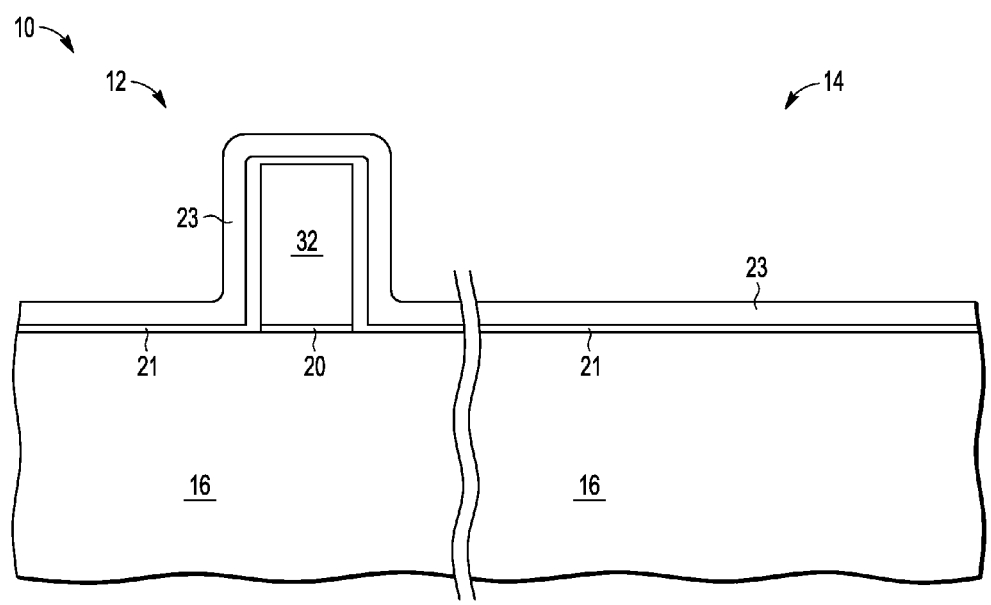
FIG. 7 is a cross section of the semiconductor device of FIG. 6 at a subsequent stage in processing.

Shown in FIG. 7 is semiconductor device 10 after forming dielectric layer 21 on the exposed portions of NVM region 12 and logic region 14 and on control gate 32. Dielectric layer 21 on substrate 16 is thermally grown and may be referenced as a thermal oxide layer which is an oxide layer grown using heat rather than an oxide layer that is deposited. Dielectric layer 21 on control gate is also oxide but is mostly deposited oxide. Thus dielectric layer 21 may be referenced as oxide layer 21. Oxide layer 21 on control gate 32 is formed by first depositing a conformal oxide layer followed by an anisotropic etch which forms a sidewall spacer around control gate 32 and which removes the conformal oxide layer from substrate 16. A thermal oxidation step is then performed resulting in oxide layer 21 being grown on substrate 16. This growing of oxide layer 21 on substrate 16 is at a relatively high temperature, greater than a temperature which would cause damage to metal layers if the metal layers had been previously formed. The result is oxide layer 21 on substrate 16 is high quality and effective as a gate dielectric for a select gate to be formed. Oxide layer 21 may be thicker on control gate 32, where it is nearly all deposited and only slightly grown, than it is on substrate 16 where it may be only grown. A layer 23 of polysilicon is formed on oxide layer 21 in NVM region 12 and logic region 14. Polysilicon layer 23 is thicker than oxide layer 21 but significantly thinner than the height of control gate 32. Layer 23 functions as a hard mask during processing of logic region 14 and is particularly important in protecting oxide layer 21 where it is on substrate 16 and will function as a gate dielectric for the select gate to be formed.

Figure 8:
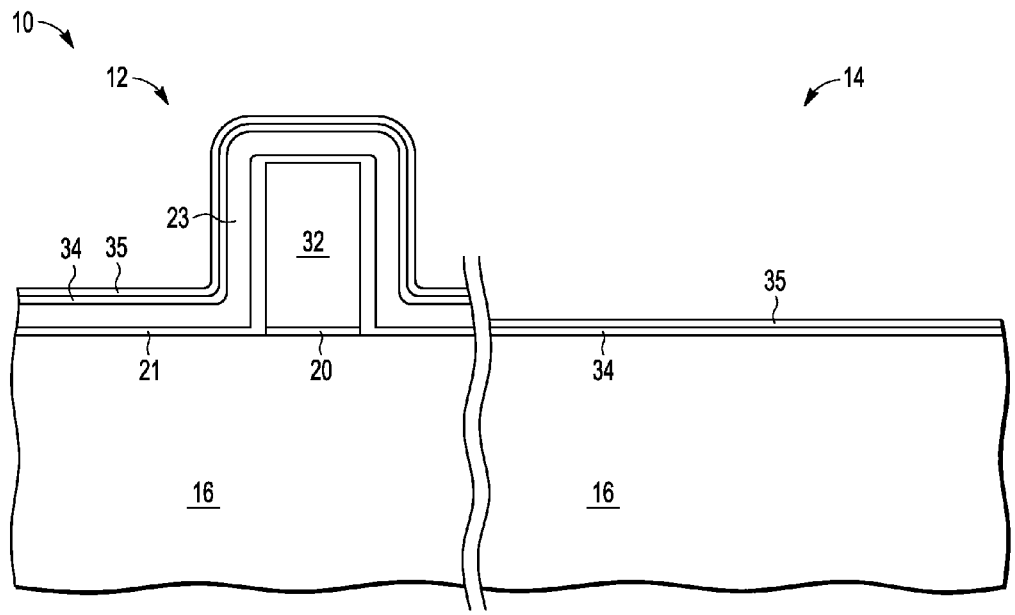
FIG. 8 is a cross section of the semiconductor device of FIG. 7 at a subsequent stage in processing.

Shown in FIG. 8 is semiconductor device 10 after removing oxide layer 21 and polysilicon layer 23 from logic region 14 and depositing a high-k dielectric layer 34 and a metal layer 35 that will function as a work-function-setting layer for a logic transistor to be formed.

Figure 9:
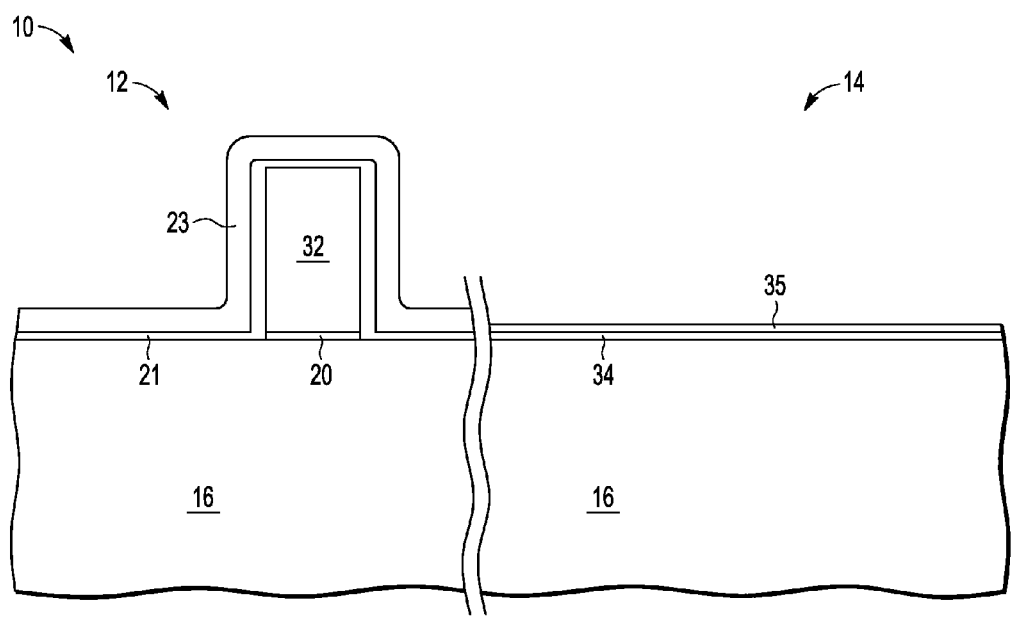
FIG. 9 is a cross section of the semiconductor device of FIG. 8 at a subsequent stage in processing.

Shown in FIG. 9 is semiconductor device 10 after removing high-k dielectric layer 34 and metal layer 35 from NVM region 12.

Figure 10:
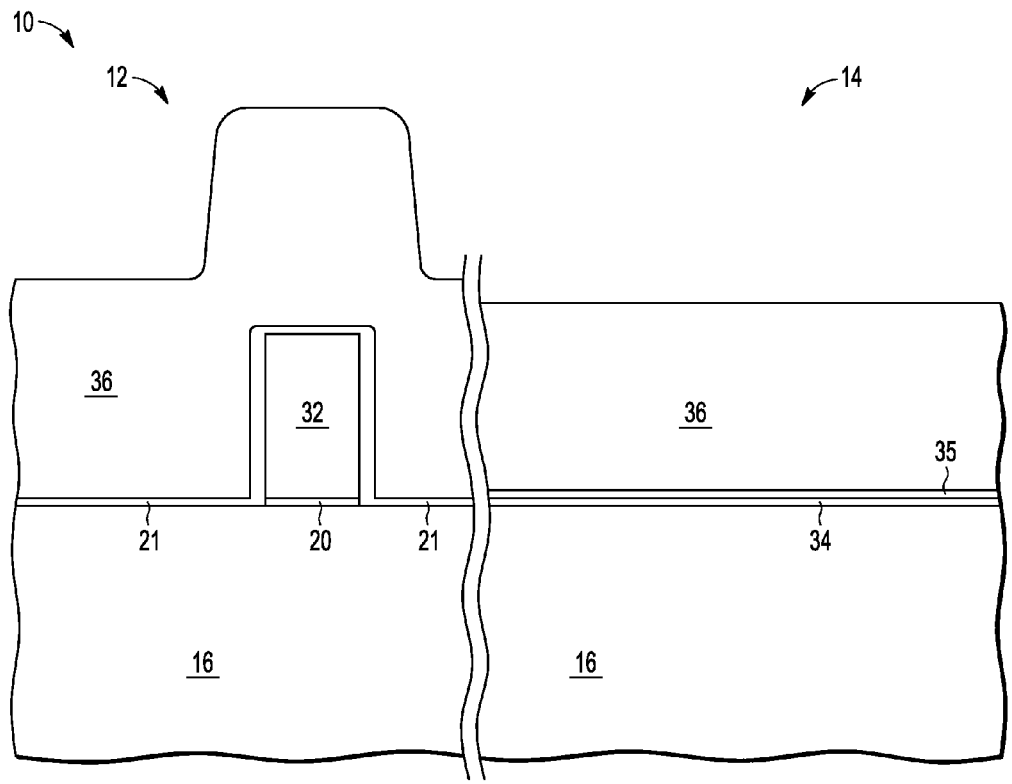
FIG. 10 is a cross section of the semiconductor device of FIG. 9 at a subsequent stage in processing.

Shown in FIG. 10 is semiconductor device 10 after forming a polysilicon layer 36 which results from depositing a polysilicon layer that merges with polysilicon layer 23 in NVM region 12 but simply deposited over metal layer 35 in logic region 14. The result is that polysilicon layer 36 is thicker in NVM region 12 than it is over logic region 14.

Figure 11:
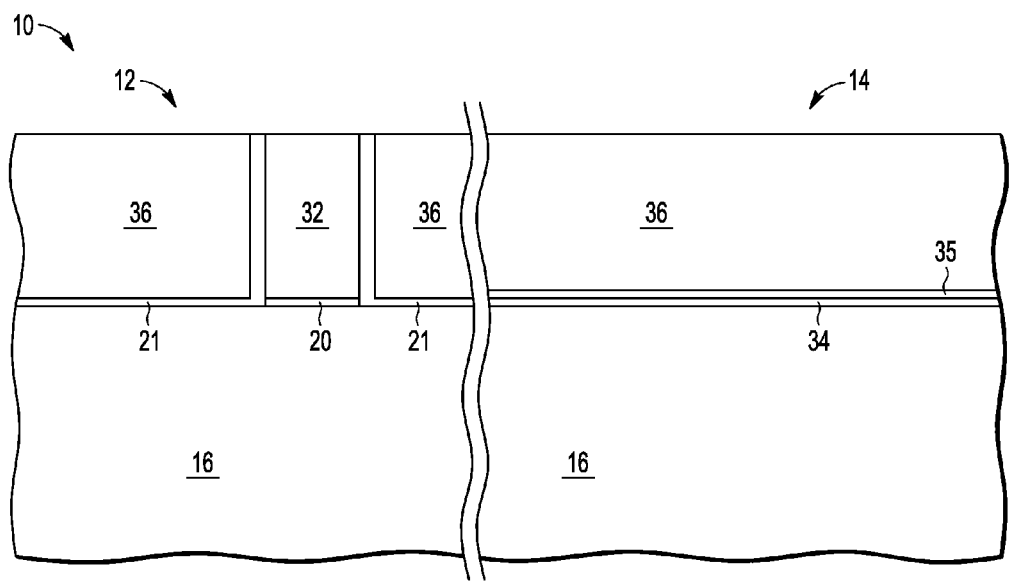
FIG. 11 is a cross section of the semiconductor device of FIG. 10 at a subsequent stage in processing.

Shown in FIG. 11 is semiconductor device 10 with polysilicon layers 23 and 36 merged into a single layer after performing a planarization process such as chemical mechanical polishing (CMP) on layer 36 to leave layer 36 in a planar form having a height about the same as control gate 32. The CMP process may be preceded by first depositing a sacrificial layer to support the protrusions and thereby reduce the likelihood of failures where the protrusions are.

Figure 12:
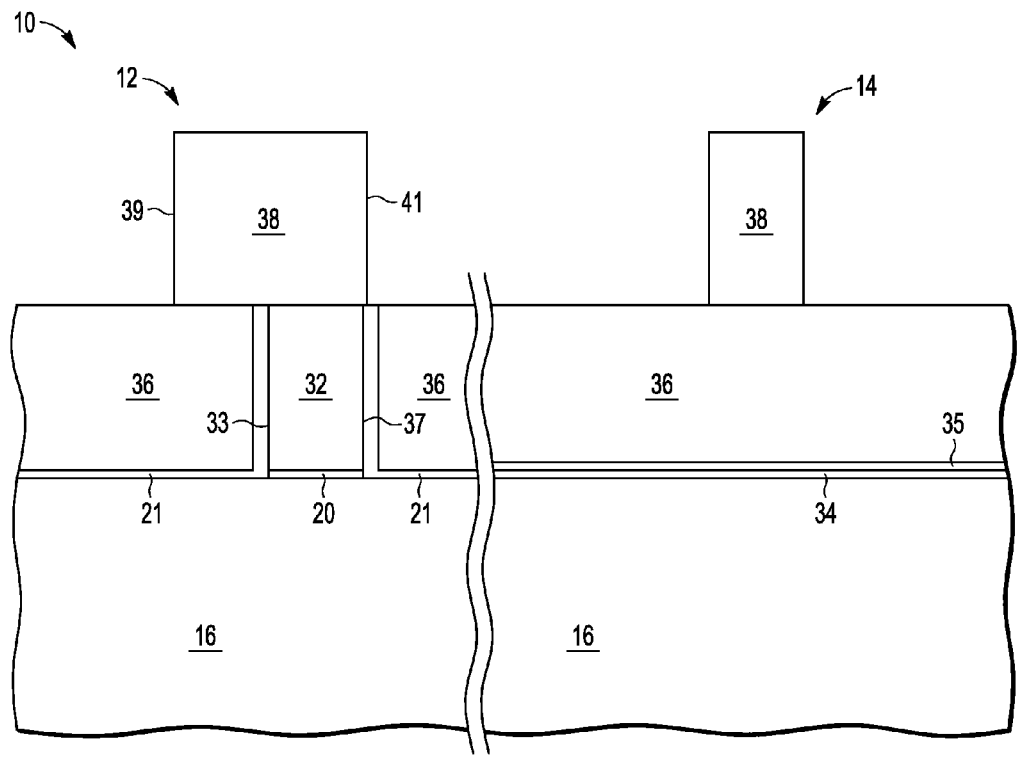
FIG. 12 is a cross section of the semiconductor device of FIG. 11 at a subsequent stage in processing.

Shown in FIG. 12 is semiconductor device 10 after forming patterned photoresist 38 which has a first portion in NVM region 12 over control gate 32 that has a first sidewall 39 extending away from a first sidewall 33 of control gate 32 for defining the select gate. The first portion of patterned photoresist 38 in NVM region 12 has a second sidewall 41 substantially aligned to oxide layer 21 where oxide layer 21 is along a second sidewall 37 of control gate 32. Second sidewall 37 of control gate 32 is opposite first sidewall 33 of control gate 32. The horizontal thickness of oxide layer 21 along the sidewalls of control gate 32 is preferably at least twice the alignment tolerance for the second sidewall 41 of photoresist 38 in NVM region 12 so that second sidewall 41 of photoresist 38 in NVM region 12 is neither over control gate 32 nor over polysilicon layer 36 but only over oxide layer 21 along the second sidewall 37 of control gate 32. Patterned photoresist 38 has a second portion in logic region 14 that will be used to define a gate of a logic transistor.

Figure 13:
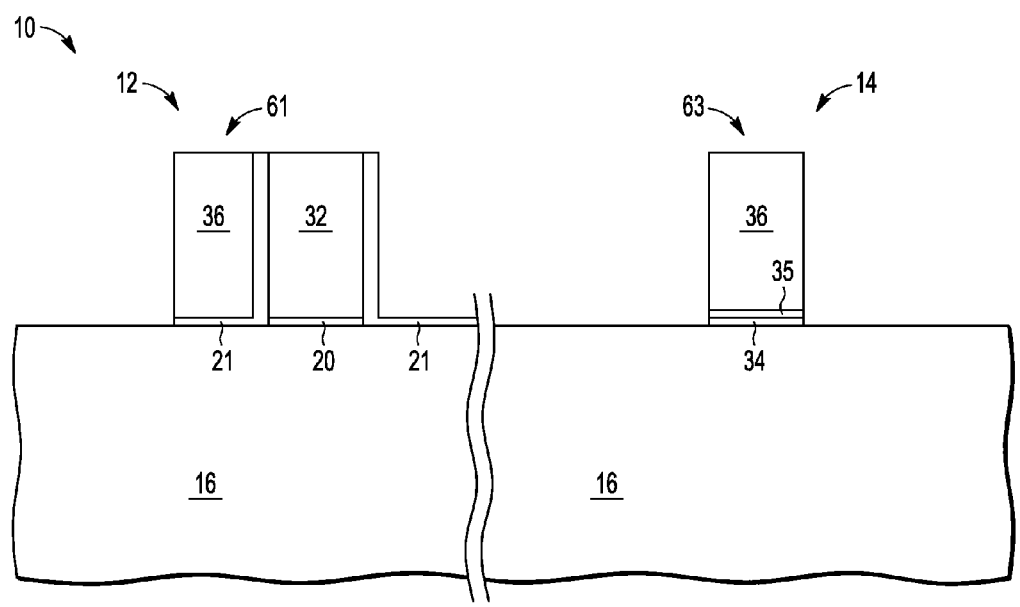
FIG. 13 is a cross section of the semiconductor device of FIG. 12 at a subsequent stage in processing.

Shown in FIG. 13 is semiconductor device 10 after performing an etch using patterned photoresist 38 as a mask leaving a first portion of polysilicon layer 36 in NVM portion 12, which is the select gate and may be referenced as select gate 61, adjacent to control gate 32 in NVM region 12 and a second portion of polysilicon layer 36, which may be referenced as dummy gate 63, in logic region 14. Also removed is the portion of oxide layer 21 that was not covered by patterned photoresist 38. Oxide layer 21 may remain over control gate 32. Dummy gate 63 will be replaced by a metal fill during subsequent processing. In an alternate embodiment, the steps of patterning the select gate and dummy logic gate may be done in separate steps.

Figure 14:
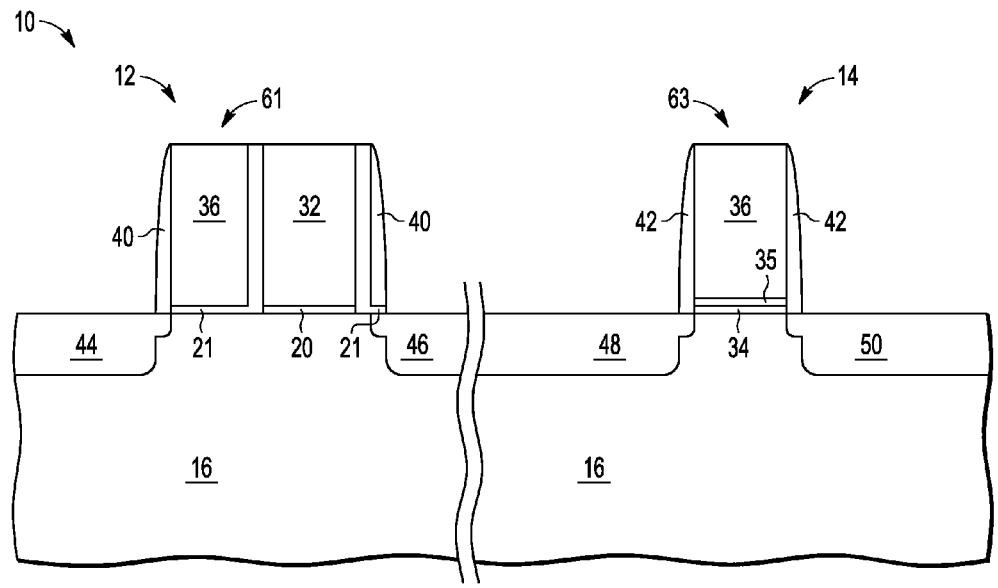
FIG. 14 is a cross section of the semiconductor device of FIG. 13 at a subsequent stage in processing.

Shown in FIG. 14 is semiconductor device 10 after forming sidewall spacers and performing implants in typical fashion for forming transistors resulting in a sidewall spacer 40 around the first portion of polysilicon layer 36 and control gate 32, a source/drain region 44 in substrate 16 substantially aligned to a first sidewall of select gate 61, a source/drain region 46 substantially aligned to the second sidewall of control gate 32, a sidewall spacer 42 around dummy gate 63, a source/drain region 48 substantially aligned to a first sidewall of dummy gate 63, and a source/drain region 50 substantially aligned to a second sidewall of dummy gate 63. Subsequent to the source/drain formation, the gates and source/drain regions may be silicided using conventional processing. Sidewall spacers 40 and 42 may additionally have a liner layer between the gate and the spacer. In an alternate embodiment, source/drain regions 44 and 46 may be formed separately from source/drain regions 48 and 50.

Figure 15:
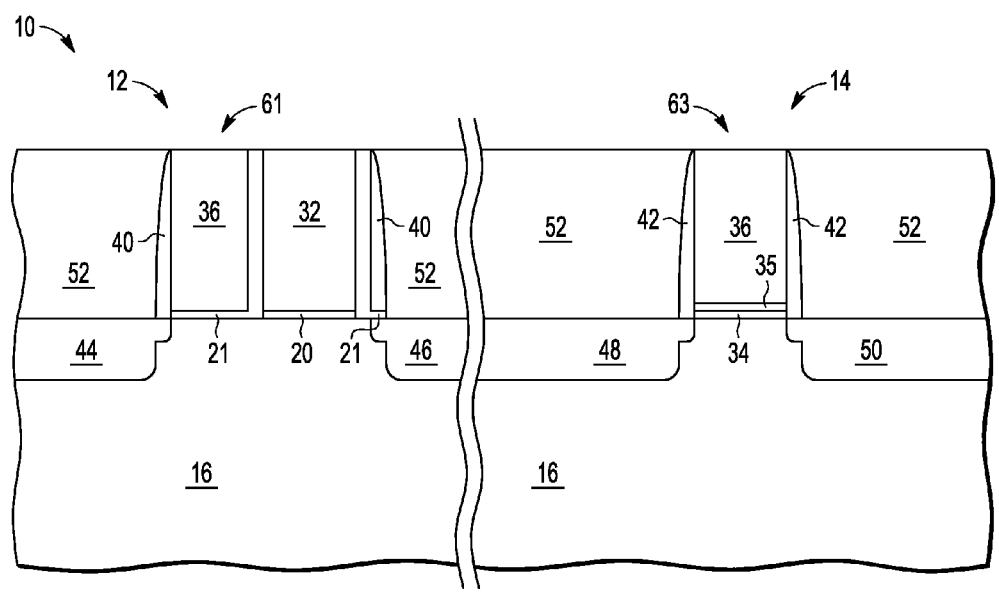
FIG. 15 is a cross section of the semiconductor device of FIG. 14 at a subsequent stage in processing.

Shown in FIG. 15 is semiconductor device 10 after forming an interlayer dielectric (ILD) 52 by deposition followed by CMP. FIG. 15 thus shows ILD 52 having portions around sidewall spacers 40 and 42. The CMP results in select gate 61, control gate 32 and dummy gate 63 being exposed. The CMP removes the small gap region that may form between the top portions of select gate 61 and control gate 32 during formation of sidewall spacers 40 and 42.

Figure 16:
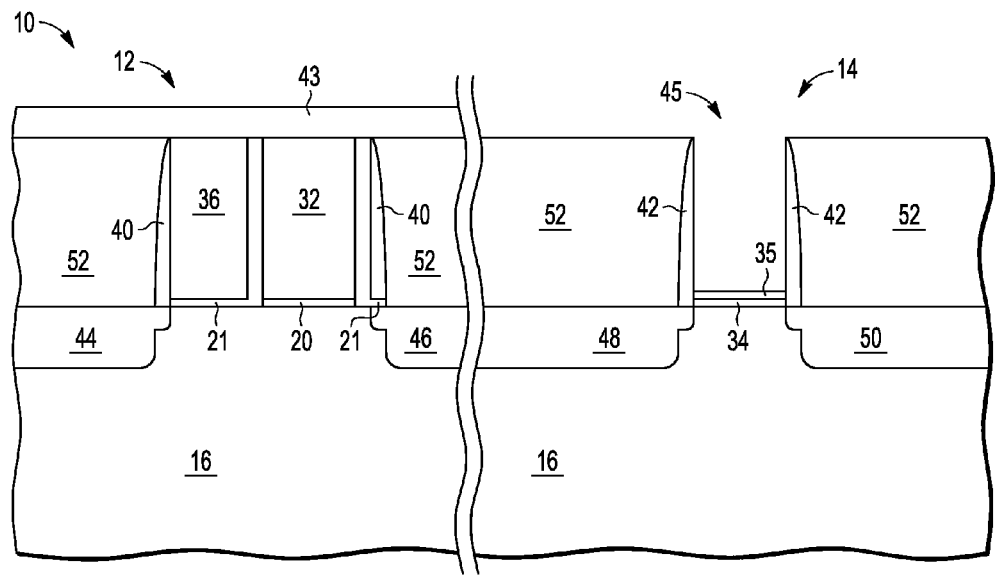
FIG. 16 is a cross section of the semiconductor device of FIG. 15 at a subsequent stage in processing.

Shown in FIG. 16 is semiconductor device 10 after forming a hard mask layer 43 over NVM portion 12 and then removing dummy gate 63. Hard mask layer 43 may comprise silicon nitride. The removal of dummy gate 63 may be achieved without a mask. Hard mask layer 43 may be formed by a blanket deposition followed by removing the portion of the blanket deposition over the logic region. The removal of dummy gate 63 leaves an opening 45 inside sidewall spacer 42 and the top surface of metal layer 35, which is the work-function-setting layer, exposed.

Figure 17:
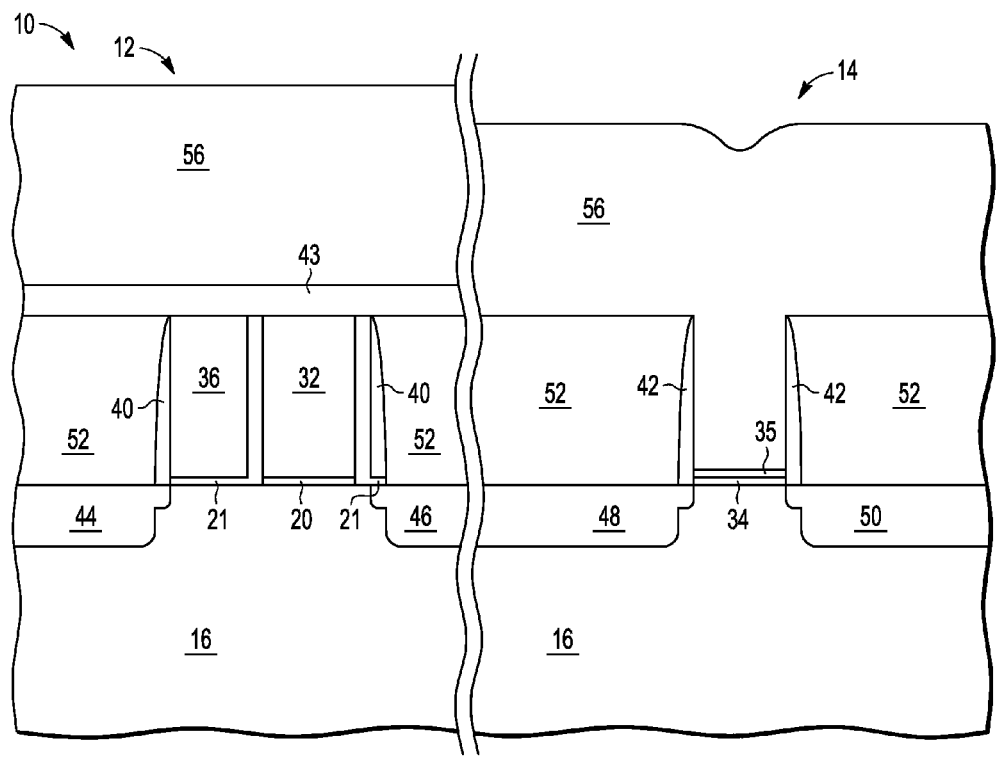
FIG. 17 is a cross section of the semiconductor device of FIG. 16 at a subsequent stage in processing.

Shown in FIG. 17 is semiconductor device 10 after forming a gate material 56 that fills opening 45 formed by removing dummy gate 63 as shown FIG. 16. Gate material 56 may be metal or some combination of metal and polysilicon.

Figure 18:
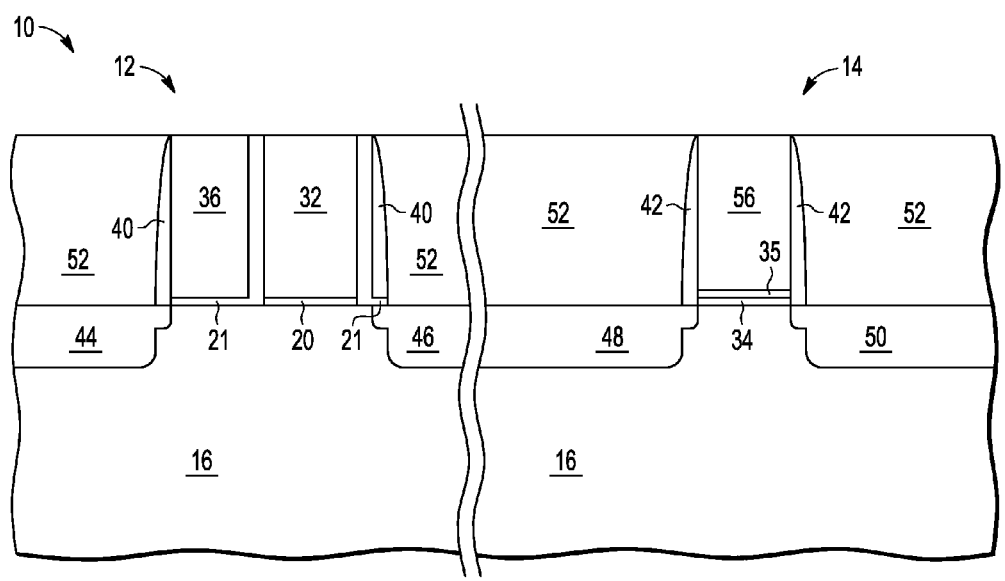
FIG. 18 is a cross section of the semiconductor device of FIG. 17 at a subsequent stage in processing.

Shown in FIG. 18 is semiconductor device 10 after performing CMP. The result is hard mask layer 43 and gate material 56 are removed in NVM region 12 and gate material 56 is removed in logic region 14 over ILD 52. This leaves a logic gate 56 in logic region 14 contained within opening 45 shown in FIG. 16 inside sidewall spacer 42. This results in a completed NVM cell in NVM region 12 and a completed logic transistor in logic region 14.

Thus an efficient manner of forming an NVM memory cell and a logic transistor is achieved in which the gate dielectrics can be thermally grown or high-k, the gates can be polysilicon or metal, and the storage layer can be polysilicon or metal nanocrystals. In an alternate embodiment, the storage layer can be nitride.

By now it should be apparent there has been disclosed a method of making a logic transistor in a logic region of a substrate and a non-volatile memory (NVM) cell in an NVM region of the substrate. The method includes forming a control gate overlying a charge storage layer over the substrate in the NVM region. The method further includes forming a thermally-grown oxygen-containing dielectric layer on the substrate and the control gate in the NVM region and on the substrate in the logic region. The method further includes removing the thermally-grown oxygen-containing dielectric layer from the logic region. The method further includes forming a high-k gate dielectric layer over the substrate in the logic region. The method further includes forming a barrier layer over the high-k gate dielectric layer in the logic region. The method further includes forming a polysilicon layer over the thermally-grown oxygen-containing dielectric layer in the NVM region and over the barrier layer in the logic region. The method further includes planarizing the polysilicon layer. The method further includes forming a first masking layer over the polysilicon layer and control gate in the NVM region, wherein the first masking layer defines a select gate location laterally adjacent the control gate in the NVM region. The method further includes forming a second masking layer over the polysilicon layer in the logic region, wherein the second masking layer defines a logic gate location in the logic region. The method further includes using the first masking layer to remove exposed portions of the polysilicon layer in the NVM region, wherein a first portion of the polysilicon layer remains at the select gate location to form a select gate. The method further includes using the second masking layer to remove exposed portions of the polysilicon layer in the logic region, wherein a second portion of the polysilicon layer remains at the logic gate location. The method further includes forming a dielectric layer in the NVM region and the logic region, wherein the dielectric layer is formed over the select gate, the control gate, and the second portion of the polysilicon layer. The method further includes planarizing the dielectric layer to expose the second portion of the polysilicon layer. The method further includes removing the second portion of the polysilicon layer to result in an opening at the logic gate location, wherein the opening exposes the barrier layer. The method may have a further characterization by which the step of forming the first masking layer is performed such that the first masking layer is directly over the control gate, and a first edge of the first masking layer extends laterally from the control gate onto the polysilicon layer to define the select gate location laterally adjacent the control gate in the NVM region. The method may further include forming a protection layer over the select gate and the control gate in the NVM region, wherein the protection layer exposes the logic region. The method may further include, prior to the step of forming the thermally-grown oxygen-containing dielectric layer, forming an oxide spacer on a sidewall of the control gate. The method may have a further characterization by which the first masking layer and the second masking layer are portions of a same patterned masking layer, and wherein the steps of using the first masking layer to remove exposed portions of the polysilicon layer in the NVM region and using the second masking layer to remove exposed portions of the polysilicon layer in the logic region are performed simultaneously. The method may have a further characterization by which the barrier layer comprises a work-function-setting metal. The method may have a further characterization by which wherein the step of forming the control gate overlying the charge storage layer over the substrate in the NVM region includes forming the charge storage layer over the substrate in the NVM region and the logic region; forming a second polysilicon layer over the charge storage layer in the NVM region and the logic region; and patterning the second polysilicon layer and the charge storage layer to form the control gate in the NVM region and to remove the second polysilicon layer and the charge storage layer from the logic region. The method may have a further characterization by which after the select gate is formed, a portion of the thermally-grown oxygen-containing dielectric layer is located between the select gate and the control gate. The method may have a further characterization by which after the steps of using the first and second masking layers to remove exposed portions of the polysilicon layer in the NVM region and the logic region, the method further includes forming a first source/drain region in the substrate laterally adjacent the select gate and a second source/drain region in the substrate laterally adjacent the control gate, such that the select gate and the control gate are located between the first and second source/drain regions; and forming a third source/drain region in the substrate laterally adjacent a first sidewall of the second portion of the polysilicon layer and a fourth source/drain region in the substrate laterally adjacent a second sidewall of the second portion of the polysilicon layer. The method may have a further characterization by which, after the step of using the first and second masking layers to remove exposed portions of the polysilicon layer in the NVM region and the logic region, the method further includes forming a first sidewall spacer surrounding outer sidewalls of the select gate and the control gate and a second sidewall spacer surrounding the second portion of the polysilicon layer. The method may further include, prior to the step of removing the thermally-grown oxygen-containing dielectric layer from the logic region, forming a second polysilicon layer over the thermally-grown oxygen-containing dielectric layer, wherein the polysilicon layer is formed over the second polysilicon layer, and wherein the step of removing the thermally-grown oxygen-containing dielectric layer further comprises removing the second polysilicon layer from the logic region. The method may have a further characterization by which the steps of forming the high-k gate dielectric layer and forming the barrier layer include forming the high-k gate dielectric layer over the second polysilicon layer in the NVM region and over the substrate in the logic region; forming the barrier layer over the high-k gate dielectric layer in the NVM region and in the logic region; and removing the high-k gate dielectric layer and the barrier layer from the NVM region. The method may have a further characterization by which the charge storage layer comprises at least one of nanocrystals or a nitride. The method may have a further characterization by which after the step of removing the second portion of the polysilicon layer to result in the opening at the logic gate location, the method further includes forming a logic gate layer over the protection layer in the NVM region and within the opening on the barrier layer in the logic region; and planarizing the logic gate layer to result in a logic gate in the logic gate location, wherein the planarizing removes the protection layer from the NVM region.

Also described is a method of making a logic transistor in a logic region of a substrate and a non-volatile memory (NVM) cell in an NVM region of the substrate. The method includes forming a control gate overlying a charge storage layer over the substrate in the NVM region, wherein the control gate comprises polysilicon. The method further includes forming an oxide spacer on a sidewall of the control gate. The method further includes thermally growing an oxygen-containing dielectric layer on the substrate in the NVM region, on the control gate, and on the substrate in the logic region. The method further includes removing the oxygen-containing dielectric layer from the logic region. The method further includes forming a high-k gate dielectric layer over the substrate in the logic region. The method further includes forming a barrier layer over the high-k gate dielectric layer in the logic region. The method further includes forming a polysilicon layer over the oxygen-containing dielectric layer in the NVM region and over the barrier layer in the logic region. The method further includes planarizing the polysilicon layer, wherein the oxygen-containing dielectric layer comprises a sidewall portion located along a sidewall of the control gate. The method further includes forming a first masking layer over the polysilicon layer and control gate in the NVM region, wherein the first masking layer defines a select gate location laterally adjacent the control gate in the NVM region, wherein the first masking layer is directly over the control gate, and a first edge of the first masking layer extends laterally from the control gate onto the polysilicon layer to define the select gate location laterally adjacent the control gate in the NVM region. The method further includes forming a second masking layer over the polysilicon layer in the logic region, wherein the second masking layer defines a logic gate location in the logic region. The method further includes using the first masking layer to remove exposed portions of the polysilicon layer in the NVM region, wherein a first portion of the polysilicon layer remains at the select gate location to form a select gate. The method further includes using the second masking layer to remove exposed portions of the polysilicon layer in the logic region, wherein a second portion of the polysilicon layer remains at the logic gate location. The method further includes forming a dielectric layer in the NVM region and the logic region, wherein the dielectric layer is formed over the select gate, the control gate, and the second portion of the polysilicon layer. The method further includes planarizing the dielectric layer to expose the second portion of the polysilicon layer. The method further includes forming a protection layer over the select gate and the control gate in the NVM region, wherein the protection layer exposes the logic region. The method further includes removing the second portion of the polysilicon layer to result in an opening at the logic gate location, wherein the opening exposes the barrier layer. The method further includes forming a logic gate layer over the protection layer in the NVM region and within the opening on the barrier layer in the logic region. The method further includes planarizing the logic gate layer to result in a logic gate in the logic gate location, wherein the planarizing removes the protection layer from the NVM region. The method may further include prior to the step of removing the oxygen-containing dielectric layer from the logic region, forming a second polysilicon layer over the thermally-grown oxygen-containing dielectric layer, and wherein the step of removing the oxygen-containing dielectric layer further comprises removing the second polysilicon layer from the logic region. The method may have a further characterization by which the steps of forming the high-k gate dielectric layer and forming the barrier layer include forming the high-k gate dielectric layer over the second polysilicon layer in the NVM region and over the substrate in the logic region; forming the barrier layer over the high-k gate dielectric layer in the NVM region and in the logic region; and removing the high-k gate dielectric layer and the barrier layer from the NVM region. The method may have a further characterization by which wherein after the step of using the patterned masking layer to remove exposed portions of the polysilicon layer and prior to the step of forming the protection layer in the NVM region and the logic region, the method further includes forming a first source/drain region in the substrate laterally adjacent the select gate and a second source/drain region in the substrate laterally adjacent the control gate, such that the select gate and the control gate are located between the first and second source/drain regions; forming a third source/drain region in the substrate laterally adjacent a first sidewall of the second portion of the polysilicon layer and a fourth source/drain region in the substrate laterally adjacent a second sidewall of the second portion of the polysilicon layer; and forming a first sidewall spacer surrounding outer sidewalls of the select gate and the control gate. The method may have a further characterization by which the barrier layer comprises a work-function-setting metal.

Disclosed also is a method of making a logic transistor in a logic region of a substrate and a non-volatile memory (NVM) cell in an NVM region of the substrate. The method includes forming a control gate overlying a charge storage layer over the substrate in the NVM region, wherein the control gate comprises polysilicon and the charge storage layer comprises at least one of nanocrystals or a nitride. The method further includes. The method further includes forming a thermally-grown oxygen-containing dielectric layer on the substrate and the control gate in the NVM region and on the substrate in the logic region. The method further includes forming a first polysilicon layer over the thermally-grown oxygen-containing dielectric layer in the NVM region and the logic region. The method further includes removing the thermally-grown oxygen-containing dielectric layer and the first polysilicon layer from the logic region. The method further includes forming a high-k gate dielectric layer over the first polysilicon layer in the NVM region and over the substrate in the logic region. The method further includes forming a barrier layer over the high-k gate dielectric layer in the NVM region and in the logic region. The method further includes removing the high-k gate dielectric layer and the barrier layer from the NVM region; forming a second polysilicon layer over the first polysilicon layer in the NVM region and over the barrier layer in the logic region. The method further includes planarizing the second polysilicon layer, wherein the thermally-grown oxygen-containing dielectric layer comprises a sidewall portion located along a sidewall of the control gate. The method further includes forming a first masking layer over the polysilicon layer and control gate in the NVM region, wherein the first masking layer defines a select gate location laterally adjacent the control gate in the NVM region, wherein the first masking layer is directly over the control gate, and a first edge of the first masking layer extends laterally from the control gate onto the second polysilicon layer to define the select gate location laterally adjacent the control gate in the NVM region. The method further includes forming a second masking layer over the second polysilicon layer in the logic region, wherein the second masking layer defines a logic gate location in the logic region. The method further includes using the first masking layer to remove exposed portions of the second polysilicon layer in the NVM region, wherein a first portion of the second polysilicon layer remains at the select gate location to form a select gate. The method further includes using the second masking layer to remove exposed portions of the second polysilicon layer in the logic region, wherein a second portion of the second polysilicon layer remains at the logic gate location. The method further includes forming a dielectric layer in the NVM region and the logic region, wherein the dielectric layer is formed over the select gate, the control gate, and the second portion of the second polysilicon layer. The method further includes planarizing the dielectric layer to expose the second portion of the second polysilicon layer. The method further includes forming a protection layer over the select gate and the control gate in the NVM region, wherein the protection layer exposes the logic region. The method further includes removing the second portion of the second polysilicon layer to result in an opening at the logic gate location, wherein the opening exposes the barrier layer. The method further includes forming a logic gate layer over the protection layer in the NVM region and within the opening on the barrier layer in the logic region. The method further includes planarizing the logic gate layer to result in a logic gate in the logic gate location, wherein the planarizing removes the protection layer from the NVM region.

Although the invention is described herein with reference to specific embodiments, various modifications and changes can be made without departing from the scope of the present invention as set forth in the claims below. For example, the various dimensions may be different than those described. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a logic transistor in a logic region of a substrate and a non-volatile memory (NVM) cell in an NVM region of the substrate, comprising:
    forming a control gate overlying a charge storage layer over the substrate in the NVM region;
    forming a thermally-grown oxygen-containing dielectric layer on the substrate and the control gate in the NVM region and on the substrate in the logic region;
    removing the thermally-grown oxygen-containing dielectric layer from the logic region;
    forming a high-k gate dielectric layer over the substrate in the logic region;
    forming a barrier layer over the high-k gate dielectric layer in the logic region;
    forming a polysilicon layer over the thermally-grown oxygen-containing dielectric layer in the NVM region and over the barrier layer in the logic region;
    planarizing the polysilicon layer;
    forming a first masking layer over the polysilicon layer and control gate in the NVM region, wherein the first masking layer defines a select gate location laterally adjacent the control gate in the NVM region;
    forming a second masking layer over the polysilicon layer in the logic region, wherein the second masking layer defines a logic gate location in the logic region;
    using the first masking layer to remove exposed portions of the polysilicon layer in the NVM region, wherein a first portion of the polysilicon layer remains at the select gate location to form a select gate;
    using the second masking layer to remove exposed portions of the polysilicon layer in the logic region, wherein a second portion of the polysilicon layer remains at the logic gate location;
    forming a dielectric layer in the NVM region and the logic region, wherein the dielectric layer is formed over the select gate, the control gate, and the second portion of the polysilicon layer;
    planarizing the dielectric layer to expose the second portion of the polysilicon layer; and
    removing the second portion of the polysilicon layer to result in an opening at the logic gate location, wherein the opening exposes the barrier layer.

2. The method of claim 1, wherein the step of forming the first masking layer is performed such that:
    the first masking layer is directly over the control gate, and a first edge of the first masking layer extends laterally from the control gate onto the polysilicon layer to define the select gate location laterally adjacent the control gate in the NVM region.

3. The method of claim 1, further comprising:
    forming a protection layer over the select gate and the control gate in the NVM region, wherein the protection layer exposes the logic region.

4. The method of claim 1, further comprising:
    prior to the step of forming the thermally-grown oxygen-containing dielectric layer, forming an oxide spacer on a sidewall of the control gate.

5. The method of claim 1, wherein the first masking layer and the second masking layer are portions of a same patterned masking layer, and wherein the steps of using the first masking layer to remove exposed portions of the polysilicon layer in the NVM region and using the second masking layer to remove exposed portions of the polysilicon layer in the logic region are performed simultaneously.

6. The method of claim 1, wherein the barrier layer comprises a work-function-setting metal.

7. The method of claim 1, wherein the step of forming the control gate overlying the charge storage layer over the substrate in the NVM region comprises:
  forming the charge storage layer over the substrate in the NVM region and the logic region;
  forming a second polysilicon layer over the charge storage layer in the NVM region and the logic region; and
  patterning the second polysilicon layer and the charge storage layer to form the control gate in the NVM region and to remove the second polysilicon layer and the charge storage layer from the logic region.

8. The method of claim 1, wherein after the select gate is formed, a portion of the thermally-grown oxygen-containing dielectric layer is located between the select gate and the control gate.

9. The method of claim 1, wherein after the steps of using the first and second masking layers to remove exposed portions of the polysilicon layer in the NVM region and the logic region, the method further comprises:
  forming a first source/drain region in the substrate laterally adjacent the select gate and a second source/drain region in the substrate laterally adjacent the control gate, such that the select gate and the control gate are located between the first and second source/drain regions; and
  forming a third source/drain region in the substrate laterally adjacent a first sidewall of the second portion of the polysilicon layer and a fourth source/drain region in the substrate laterally adjacent a second sidewall of the second portion of the polysilicon layer.

10. The method of claim 9, wherein after the step of using the first and second masking layers to remove exposed portions of the polysilicon layer in the NVM region and the logic region, the method further comprises:
  forming a first sidewall spacer surrounding outer sidewalls of the select gate and the control gate and a second sidewall spacer surrounding the second portion of the polysilicon layer.

11. The method of claim 1, further comprising:
  prior to the step of removing the thermally-grown oxygen-containing dielectric layer from the logic region, forming a second polysilicon layer over the thermally-grown oxygen-containing dielectric layer, wherein the polysilicon layer is formed over the second polysilicon layer, and
  wherein the step of removing the thermally-grown oxygen-containing dielectric layer further comprises removing the second polysilicon layer from the logic region.

12. The method of claim 11, wherein the steps of forming the high-k gate dielectric layer and forming the barrier layer comprise:
  forming the high-k gate dielectric layer over the second polysilicon layer in the NVM region and over the substrate in the logic region;
  forming the barrier layer over the high-k gate dielectric layer in the NVM region and in the logic region; and
  removing the high-k gate dielectric layer and the barrier layer from the NVM region.

13. The method of claim 1, wherein the charge storage layer comprises at least one of nanocrystals or a nitride.

14. The method of claim 3, wherein after the step of removing the second portion of the polysilicon layer to result in the opening at the logic gate location, the method further comprises:
  forming a logic gate layer over the protection layer in the NVM region and within the opening on the barrier layer in the logic region; and
  planarizing the logic gate layer to result in a logic gate in the logic gate location, wherein the planarizing removes the protection layer from the NVM region.

15. A method of making a logic transistor in a logic region of a substrate and a non-volatile memory (NVM) cell in an NVM region of the substrate, comprising:
  forming a control gate overlying a charge storage layer over the substrate in the NVM region, wherein the control gate comprises polysilicon;
  forming an oxide spacer on a sidewall of the control gate;
  thermally growing an oxygen-containing dielectric layer on the substrate in the NVM region, on the control gate, and on the substrate in the logic region;
  removing the oxygen-containing dielectric layer from the logic region;
  forming a high-k gate dielectric layer over the substrate in the logic region;
  forming a barrier layer over the high-k gate dielectric layer in the logic region;
  forming a polysilicon layer over the oxygen-containing dielectric layer in the NVM region and over the barrier layer in the logic region;
  planarizing the polysilicon layer, wherein the oxygen-containing dielectric layer comprises a sidewall portion located along a sidewall of the control gate;
  forming a first masking layer over the polysilicon layer and control gate in the NVM region, wherein the first masking layer defines a select gate location laterally adjacent the control gate in the NVM region, wherein:
    the first masking layer is directly over the control gate, and a first edge of the first masking layer extends laterally from the control gate onto the polysilicon layer to define the select gate location laterally adjacent the control gate in the NVM region;
  forming a second masking layer over the polysilicon layer in the logic region, wherein the second masking layer defines a logic gate location in the logic region;
  using the first masking layer to remove exposed portions of the polysilicon layer in the NVM region, wherein a first portion of the polysilicon layer remains at the select gate location to form a select gate;
  using the second masking layer to remove exposed portions of the polysilicon layer in the logic region, wherein a second portion of the polysilicon layer remains at the logic gate location;
  forming a dielectric layer in the NVM region and the logic region, wherein the dielectric layer is formed over the select gate, the control gate, and the second portion of the polysilicon layer;
  planarizing the dielectric layer to expose the second portion of the polysilicon layer;
  forming a protection layer over the select gate and the control gate in the NVM region, wherein the protection layer exposes the logic region;
  removing the second portion of the polysilicon layer to result in an opening at the logic gate location, wherein the opening exposes the barrier layer;
  forming a logic gate layer over the protection layer in the NVM region and within the opening on the barrier layer in the logic region; and
  planarizing the logic gate layer to result in a logic gate in the logic gate location, wherein the planarizing removes the protection layer from the NVM region.

16. The method of claim 15, further comprising:
prior to the step of removing the oxygen-containing dielectric layer from the logic region, forming a second polysilicon layer over the thermally-grown oxygen-containing dielectric layer, and
wherein the step of removing the oxygen-containing dielectric layer further comprises removing the second polysilicon layer from the logic region.

17. The method of claim 16, wherein the steps of forming the high-k gate dielectric layer and forming the barrier layer comprise:
forming the high-k gate dielectric layer over the second polysilicon layer in the NVM region and over the substrate in the logic region;
forming the barrier layer over the high-k gate dielectric layer in the NVM region and in the logic region; and
removing the high-k gate dielectric layer and the barrier layer from the NVM region.

18. The method of claim 15, wherein after the step of using the patterned masking layer to remove exposed portions of the polysilicon layer and prior to the step of forming the protection layer in the NVM region and the logic region, the method further comprises:
forming a first source/drain region in the substrate laterally adjacent the select gate and a second source/drain region in the substrate laterally adjacent the control gate, such that the select gate and the control gate are located between the first and second source/drain regions;
forming a third source/drain region in the substrate laterally adjacent a first sidewall of the second portion of the polysilicon layer and a fourth source/drain region in the substrate laterally adjacent a second sidewall of the second portion of the polysilicon layer; and
forming a first sidewall spacer surrounding outer sidewalls of the select gate and the control gate.

19. The method of claim 15, wherein the barrier layer comprises a work-function-setting metal.

20. A method of making a logic transistor in a logic region of a substrate and a non-volatile memory (NVM) cell in an NVM region of the substrate, comprising:
forming a control gate overlying a charge storage layer over the substrate in the NVM region, wherein the control gate comprises polysilicon and the charge storage layer comprises at least one of nanocrystals or a nitride;
forming a thermally-grown oxygen-containing dielectric layer on the substrate and the control gate in the NVM region and on the substrate in the logic region;
forming a first polysilicon layer over the thermally-grown oxygen-containing dielectric layer in the NVM region and the logic region;
removing the thermally-grown oxygen-containing dielectric layer and the first polysilicon layer from the logic region;
forming a high-k gate dielectric layer over the first polysilicon layer in the NVM region and over the substrate in the logic region;
forming a barrier layer over the high-k gate dielectric layer in the NVM region and in the logic region;
removing the high-k gate dielectric layer and the barrier layer from the NVM region;
forming a second polysilicon layer over the first polysilicon layer in the NVM region and over the barrier layer in the logic region;
planarizing the second polysilicon layer, wherein the thermally-grown oxygen-containing dielectric layer comprises a sidewall portion located along a sidewall of the control gate;
forming a first masking layer over the polysilicon layer and control gate in the NVM region, wherein the first masking layer defines a select gate location laterally adjacent the control gate in the NVM region, wherein:
the first masking layer is directly over the control gate, and a first edge of the first masking layer extends laterally from the control gate onto the second polysilicon layer to define the select gate location laterally adjacent the control gate in the NVM region;
forming a second masking layer over the second polysilicon layer in the logic region, wherein the second masking layer defines a logic gate location in the logic region;
using the first masking layer to remove exposed portions of the second polysilicon layer in the NVM region, wherein a first portion of the second polysilicon layer remains at the select gate location to form a select gate;
using the second masking layer to remove exposed portions of the second polysilicon layer in the logic region, wherein a second portion of the second polysilicon layer remains at the logic gate location;
forming a dielectric layer in the NVM region and the logic region, wherein the dielectric layer is formed over the select gate, the control gate, and the second portion of the second polysilicon layer;
planarizing the dielectric layer to expose the second portion of the second polysilicon layer;
forming a protection layer over the select gate and the control gate in the NVM region, wherein the protection layer exposes the logic region;
removing the second portion of the second polysilicon layer to result in an opening at the logic gate location, wherein the opening exposes the barrier layer;
forming a logic gate layer over the protection layer in the NVM region and within the opening on the barrier layer in the logic region; and
planarizing the logic gate layer to result in a logic gate in the logic gate location, wherein the planarizing removes the protection layer from the NVM region.

\* \* \* \* \*